United States Patent
Nikazm et al.

(10) Patent No.: US 6,301,124 B1
(45) Date of Patent: *Oct. 9, 2001

(54) COMPUTER CHASSIS IDENTIFICATION METHOD

(75) Inventors: Ayedin Nikazm; Steve J. Brame, both of Austin, TX (US)

(73) Assignee: Dell USA, L.P., Round Rock, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/245,149

(22) Filed: Feb. 4, 1999

(51) Int. Cl.[7] ............................................. H05K 7/14
(52) U.S. Cl. .................... 361/799; 361/753; 361/800; 361/816; 361/818; 439/95; 174/51
(58) Field of Search ..................... 361/752, 753, 361/759, 799, 800, 816, 818; 174/51, 35 R; 439/95

(56) References Cited

U.S. PATENT DOCUMENTS

| | | |
|---|---|---|
| 3,875,478 | 4/1975 | Capstick . |
| 5,136,466 | 8/1992 | Remise et al. . |
| 5,138,529 | 8/1992 | Colton et al. . |
| 5,184,961 | 2/1993 | Ramirez et al. . |
| 5,218,760 * | 6/1993 | Colton et al. ............................ 29/845 |
| 5,267,125 * | 11/1993 | Liu ....................................... 361/816 |
| 5,398,156 | 3/1995 | Steffes et al. . |
| 5,537,294 * | 7/1996 | Siwinski ............................... 361/753 |
| 5,668,699 | 9/1997 | Bell et al. . |
| 5,691,504 * | 11/1997 | Sands et al. ........................ 174/35 R |
| 5,833,480 * | 11/1998 | Austin .................................... 439/95 |

FOREIGN PATENT DOCUMENTS

0041406 * 4/1981 (EP) .

* cited by examiner

Primary Examiner—Jeffrey Gaffin
Assistant Examiner—Tuan Dinh
(74) Attorney, Agent, or Firm—Haynes and Boone, L.L.P.

(57) ABSTRACT

An apparatus to allow a computer system board to automatically identify the chassis in which the system board is installed. The apparatus includes a) at least one conducting pad on the system board, b) at least one spring action grounding clip on the chassis, and in contact with the at least one conducting pad, and c) a logic circuit connected to the at least one conducting pad.

9 Claims, 2 Drawing Sheets

COMPUTER CHASSIS IDENTIFICATION METHOD

TECHNICAL FIELD

This disclosure relates to the field of computer systems, and, more particularly, to apparatus and methodologies for determining whether a personal computer system board has been installed in the correct personal computer chassis.

BACKGROUND

A personal computer system board needs to recognize whether it is installed in the correct personal computer chassis. Such recognition is necessary because the system board functions differently depending on the type of chassis. Previously, encoded riser cards or jumper settings were used to determine whether the system board was installed in the correct computer chassis. However, these methods have either become obsolete or are not efficient. Accordingly, what is needed is an apparatus and a methodology for automatically determining whether a system board has been installed in the correct type of computer chassis.

SUMMARY

The present disclosure describes an apparatus and a method to allow a computer system board to automatically identify the personal computer chassis in which the system board is installed. The apparatus includes a) at least one conducting pad on the system board, b) at least one spring action grounding clip on the chassis, and in contact with the at least one conducting pad, and c) a logic circuit connected to the at least one conducting pad. The method includes the steps of a) attaching at least one spring action grounding clip to the chassis, b) incorporating at least one conducting pad into the artwork of the printed wire assembly on the system board, c) connecting at least one conducting pad to a logic circuit on the system board, d) installing the system board in the chassis, and e) ensuring that at least one spring action grounding clip contacts at least one conducting pad.

DETAILED DESCRIPTION

Figure 1:
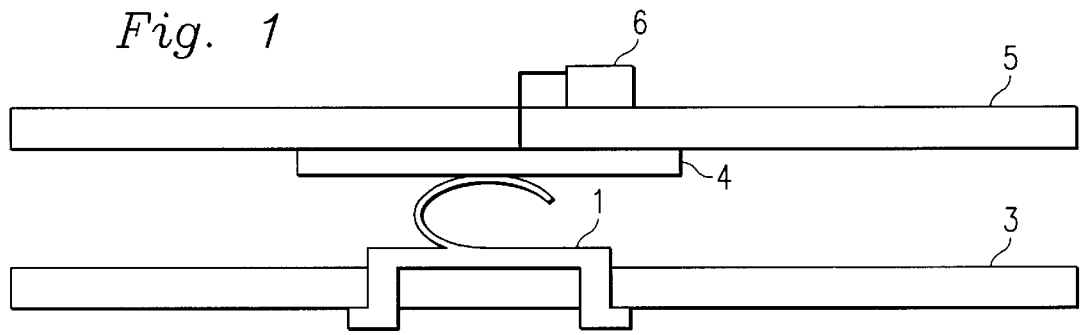
FIG. 1 is a partial cross-sectional view of a preferred embodiment.
Figure 5:
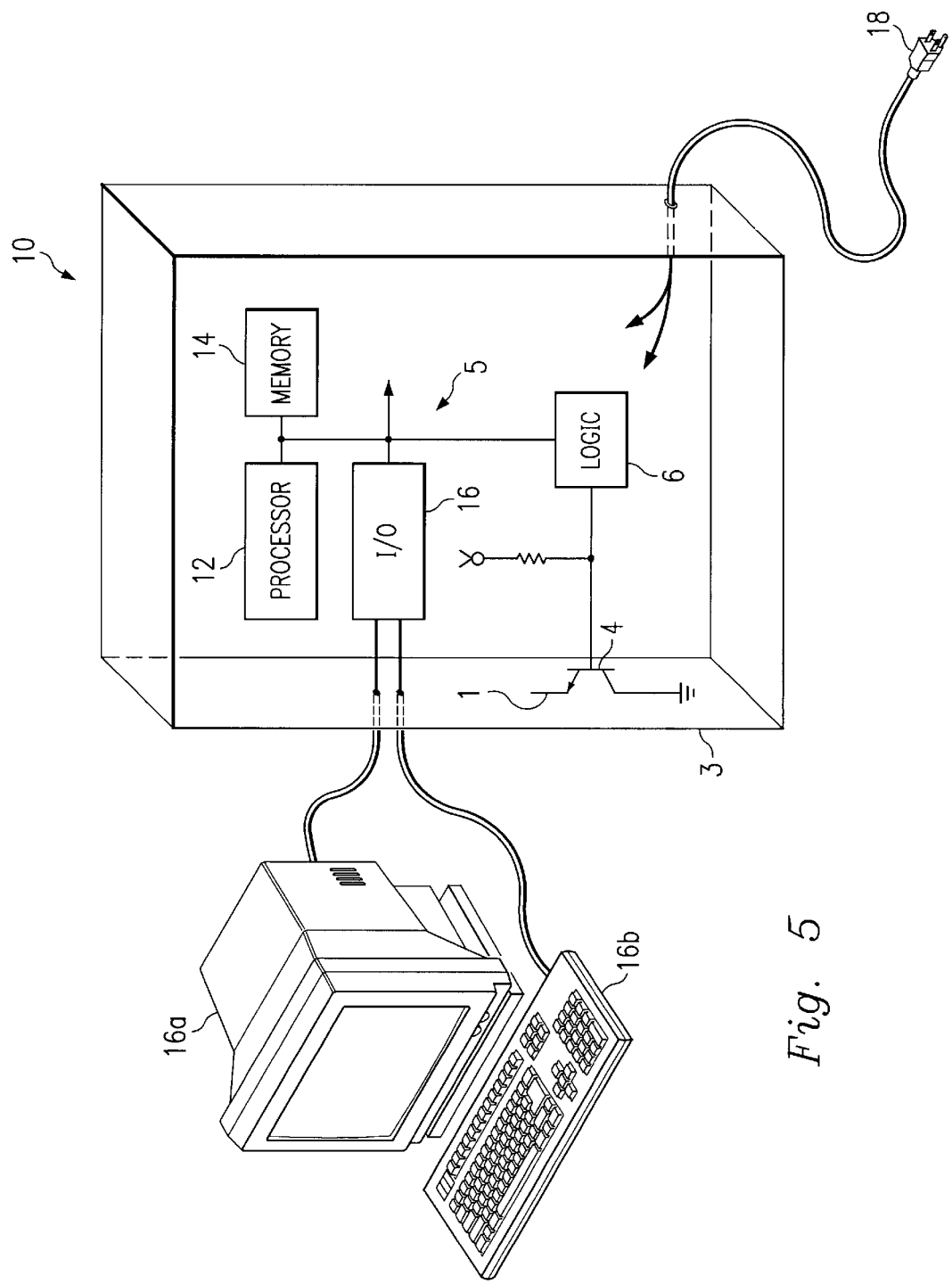
FIG. 5 is a schematic of a logic circuit on the system board.

Referring to FIG. 1, an assembler attaches a spring action grounding clip 1 to a predetermined position on a computer chassis 3. A designer incorporates a conducting pad 4 into the artwork of the printed wire assembly on a corresponding position op the bottom side of a system board 5. The conducting pad 4 connects to a logic circuit 6 on the system board 5. The assembler then installs the system board 5 in the computer chassis 3, so the spring action grounding clip 1 makes contact with the conducting pad 4 on the system board 5. Contact between the spring action grounding clip 1 and the conducting pad 4 causes a short circuit to ground, resulting in an output of logical zero on the logic circuit 6 (FIG. 5).

Figure 2:
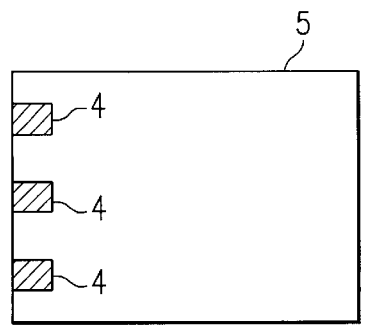
FIG. 2 is a bottom view of a system board.

FIG. 2 illustrates a potential arrangement of conducting pads 4 on the bottom side of the system board 5. The designer incorporates three conducting pads 4 into the artwork of the printed wire assembly on the bottom side of a system board 5. The location of the conducting pads 4 on the system board 5 corresponds to the possible attachment sites 7, 8, and 9 of the spring action grounding clips 1 on the computer chassis 3.

Figure 3:
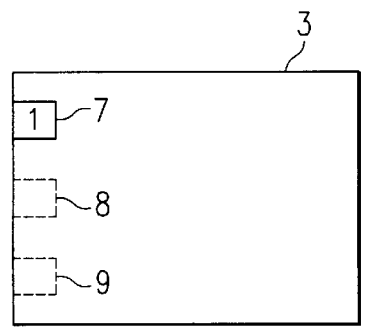
FIG. 3 is a top view of a computer chassis with one grounding clip.
Figure 4:
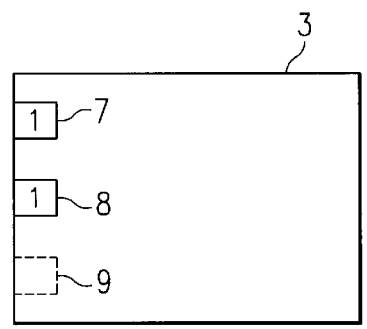
FIG. 4 is a top view of a computer chassis with two grounding clips.

Referring to FIGS. 3 and 4, the computer chassis 3 has three possible attachment sites 7, 8, and 9 for the spring action grounding clips 1. Depending on the type of chassis to be identified, the assembler may be instructed to attach spring action grounding clips 1 to some, all, or none of the attachment sites 7, 8, and 9. With multiple possible attachment sites 7, 8, and 9 to n (where n equals the number of possible attachment sites), different chassis types may be identified using a preferred embodiment. The number of attachment sites may vary depending on the number of possible chassis types to be identified.

FIG. 3 illustrates a potential arrangement of spring action grounding clips 1 on the computer chassis 3. Referring to FIG. 3, the assembler attaches the spring action grounding clip 1 to the computer chassis 3 at attachment site 7. The attachment of the spring action grounding clip 1 to the computer chassis 3 at attachment site 7 could correspond to a tower chassis.

FIG. 4 illustrates another potential arrangement of spring action grounding clips 1 on the computer chassis 3. Referring to FIG. 4, the assembler attaches the spring action grounding clips 1 to the computer chassis 3 at attachment sites 7 and 8. The attachment of the spring action grounding clips 1 to the computer chassis 3 at attachment sites 7 and 8 could correspond to a desktop chassis.

Referring to FIG. 5, the reference numeral 10 designates, in general, one embodiment of a computer for implementing the above described systems and methods. The computer 10 includes the spring action grounding clip 1, the chassis 3, the conducting pad 4, the system board 5, and the logic circuit 6. The system board 5 may also include various system components such as one or more processors 12, one or more storage devices 14, and one or more input/output devices 16 including a monitor 16a and a keyboard 16b. The computer 10 further includes the necessary power circuitry (not shown) connectable to a power supply 18 for receiving operating power. The power supply 18 includes a ground receptacle for supplying a ground voltage to the chassis 3.

In the computer 10, the presence of the spring action grounding clip 1 on the computer chassis 3 causes a short circuit to ground, and an output of logical zero on the logic circuit 6. In the absence of the spring action grounding clip 1, no short circuit to ground occurs, and the logic circuit 6 registers an output of logical one. Each conducting pad 4 has a separate logic circuit 6 associated with it. Accordingly, the output of the logic circuits 6 varies depending upon the presence or absence of spring action grounding clips 1 within the various attachment sites 7, 8, and 9.

The varying outputs on the logic circuits 6 enable the system board 5 to recognize whether the system board 5 is installed in the correct computer chassis 3. The system board 5 compares the outputs of the logic circuits 6 with a look-up table in a memory of the system board 5. The look-up table indexes the logic circuit outputs corresponding to each particular chassis type. If the outputs of the logic circuits 6 correspond to the designated chassis in the look-up table, the system board 5 is installed in the correct computer chassis 3. If the outputs of the logic circuits 6 do not correspond to the designated chassis in the look-up table, the system board 5 is not installed in the correct computer chassis 3.

Although illustrative embodiments have been shown and described, a wide range of modification, changes and substitution is contemplated in the foregoing disclosure. In some instances, some features of the disclosed embodiments may be employed without a corresponding use of the other features. Accordingly, it is appropriate that the appended claims be construed broadly and in a manner consistent with the scope of the invention.

What is claimed is:

1. A personal computer having a chassis and a system board, and having an apparatus to allow the computer system board to automatically identify the chassis in which the system board is installed, the apparatus comprising:

a plurality of conducting pads formed on the system board in a pattern;

a plurality of attachment sites formed on the chassis in a pattern corresponding to the pattern of the conducting pads;

a separate logic circuit connected to each of the conducting pads;

a spring action grounding clip attached to at least one of the attachment sites for contact with a corresponding one of the conducting pads, the presence of the spring action grounding clip causing a first output to the respective logic circuit, the absence of the spring action grounding clip causing a second output to the respective logic circuit, whereby, depending on the first or second output being received, the system board automatically identifies the chassis in which the system board is installed.

2. The personal computer of claim 1, further comprising three conducting pads.

3. The personal computer of claim 2, further comprising three spring action grounding clips.

4. An apparatus for automatic identification of a chassis in a personal computer, the apparatus comprising:

a system board;

a plurality conducting pads formed on the system board in a pattern;

a plurality of attachment sites formed on the chassis in a pattern corresponding to the pattern of the conducting pads;

a separate logic circuit connected to each of the conducting pads; and a spring action grounding clip attached at more than one of the attachment sites for contact with corresponding ones of the conducting pads, the presence of the spring action grounding clip causing an output of logical zero to the respective logic circuit, the absence of the spring action grounding clip causing an output of logical one to the respective logic circuit, whereby, in response to the output being received, the system board automatically identifies the chassis in which the system board is installed.

5. The apparatus of claim 4, further comprising three conducting pads.

6. The apparatus of claim 5, further comprising three spring action grounding clips.

7. A computer system comprising:

a chassis including at least one spring action clip electrically connected to a power source;

a system board connected to the chassis;

a plurality of conducting pads electrically connectable to the spring action clip, the pads being formed in a pattern in the system board;

a plurality of attachment sites formed on the chassis in a pattern corresponding to the pattern of the conducting pads, the spring action clip being attached to one of the attachment sites;

a separate logic circuit connected to each of the conducting pads for identifying the chassis and reporting the identification to the system board; and wherein, when the chassis is positioned in the computer, an electrical connection is made from the power source, through the spring action clip, and through the conducting pad, the presence of the spring action grounding clip causing an output of logical zero to the respective logic circuit, the absence of the spring action grounding clip causing an output of logical one to the respective logic circuit, so that in response to the output being received, the system board automatically identifies the chassis in which the system board is installed.

8. The computer system of claim 7, further comprising two additional conducting pads so that a plurality of different chassis types can be identified by the different connections of the spring action clip and the conducting pads.

9. The computer of claim 8, further comprising three spring action clips.

* * * * *